United States Patent
El-Mansouri et al.

(10) Patent No.: US 11,074,955 B2
(45) Date of Patent: *Jul. 27, 2021

(54) CELL VOLTAGE ACCUMULATION DISCHARGE

(71) Applicant: Micron Technology, Inc., Boise, ID (US)

(72) Inventors: Adam S. El-Mansouri, Boise, ID (US); David L. Pinney, Boise, ID (US)

(73) Assignee: Micron Techology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/825,832

(22) Filed: Mar. 20, 2020

(65) Prior Publication Data

US 2020/0219551 A1 Jul. 9, 2020

Related U.S. Application Data

(63) Continuation of application No. 15/975,624, filed on May 9, 2018, now Pat. No. 10,636,469.

(51) Int. Cl.
*G11C 11/22* (2006.01)
*G11C 8/10* (2006.01)
*G11C 8/08* (2006.01)

(52) U.S. Cl.
CPC .......... *G11C 11/2259* (2013.01); *G11C 8/08* (2013.01); *G11C 8/10* (2013.01); *G11C 11/221* (2013.01); *G11C 11/2257* (2013.01); *G11C 11/2273* (2013.01); *G11C 11/2275* (2013.01); *G11C 11/2255* (2013.01)

(58) Field of Classification Search
CPC ......... G11C 11/2259; G11C 8/08; G11C 8/10; G11C 11/221; G11C 11/2257; G11C 11/2273; G11C 11/2275; G11C 11/2255
USPC ........................................ 365/145
See application file for complete search history.

(56) References Cited

U.S. PATENT DOCUMENTS

| | | | |
|---|---|---|---|
| 5,574,679 A | 11/1996 | Ohtsuki et al. | |
| 5,892,728 A | 4/1999 | Allen et al. | |
| 6,292,386 B1 | 9/2001 | Hoenigschmid | |
| 7,133,321 B2 * | 11/2006 | Jung | G11C 7/06 365/202 |

(Continued)

FOREIGN PATENT DOCUMENTS

CN 105684087 A 6/2016

OTHER PUBLICATIONS

IPO, "Office Action," issued in connection with Chinese Patent Application No. 201910378466.8, dated Jun. 12, 2020 (4 pages).

*Primary Examiner* — Viet Q Nguyen
(74) *Attorney, Agent, or Firm* — Holland & Hart LLP

(57) ABSTRACT

Methods, systems, and devices for cell voltage accumulation discharge are described. One or more sections of a bank of ferroelectric memory cells may be coupled with one or more access lines. By activating one or more switching components, one or more sections (that may include a memory array and/or a driver) of memory cells may be isolated. When isolated, a voltage may be applied across an access line associated with the section to activate an access device of each memory cell. By activating a switching component of a respective memory cell, a capacitor of the memory cell may be discharged and then the isolated section may be coupled with the plurality of access lines.

20 Claims, 12 Drawing Sheets

(56) References Cited

U.S. PATENT DOCUMENTS

| | | |
|---|---|---|
| 9,715,919 B1 | 7/2017 | Ingalls et al. |
| 9,779,796 B1 | 10/2017 | Vimercati et al. |
| 9,786,347 B1 | 10/2017 | Kawamura et al. |
| 9,786,348 B1 | 10/2017 | Kawamura et al. |
| 9,786,349 B1 | 10/2017 | Calderoni et al. |
| 9,792,973 B2 | 10/2017 | Kawamura et al. |
| 9,799,388 B1 | 10/2017 | Carman |
| 9,886,991 B1 | 2/2018 | Vimercati et al. |
| 9,899,073 B2 * | 2/2018 | Kawamura ......... G11C 11/2259 |
| 10,082,964 B2 | 9/2018 | Kajigaya |
| 10,127,963 B2 | 11/2018 | Carman |
| 10,153,020 B1 | 12/2018 | Vimercati et al. |
| 10,431,281 B1 | 10/2019 | Fackental et al. |
| 10,636,469 B2 * | 4/2020 | El-Mansouri ....... G11C 11/2253 |
| 10,748,596 B2 * | 8/2020 | Ingalls .................. G11C 11/221 |
| 2016/0357454 A1 | 12/2016 | Lee et al. |
| 2017/0263304 A1 | 9/2017 | Vimercati |
| 2017/0315737 A1 | 11/2017 | Kajigaya |
| 2017/0358338 A1 | 12/2017 | Derner et al. |
| 2018/0137906 A1 | 5/2018 | Vimercati et al. |
| 2018/0308538 A1 | 10/2018 | Vo et al. |
| 2019/0027204 A1 | 1/2019 | Kim et al. |
| 2019/0066752 A1 | 2/2019 | Fackenthal et al. |
| 2019/0108866 A1 | 4/2019 | Carman et al. |

* cited by examiner

CELL VOLTAGE ACCUMULATION DISCHARGE

CROSS REFERENCE

The present Application for Patent is a continuation of U.S. patent application Ser. No. 15/975,624 by Mansouri, et al., entitled "CELL VOLTAGE ACCUMULATION DISCHARGE", filed May 9, 2018, which is assigned to the assignee hereof and is expressly incorporated by reference in its entirety herein.

BACKGROUND

The following relates generally to operating a memory array and more specifically to cell voltage accumulation discharge.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. Improvements in memory architecture or operation may be directed to problems related to power consumption associated with discharging ferroelectric memory cells.

DETAILED DESCRIPTION

Figure 1:
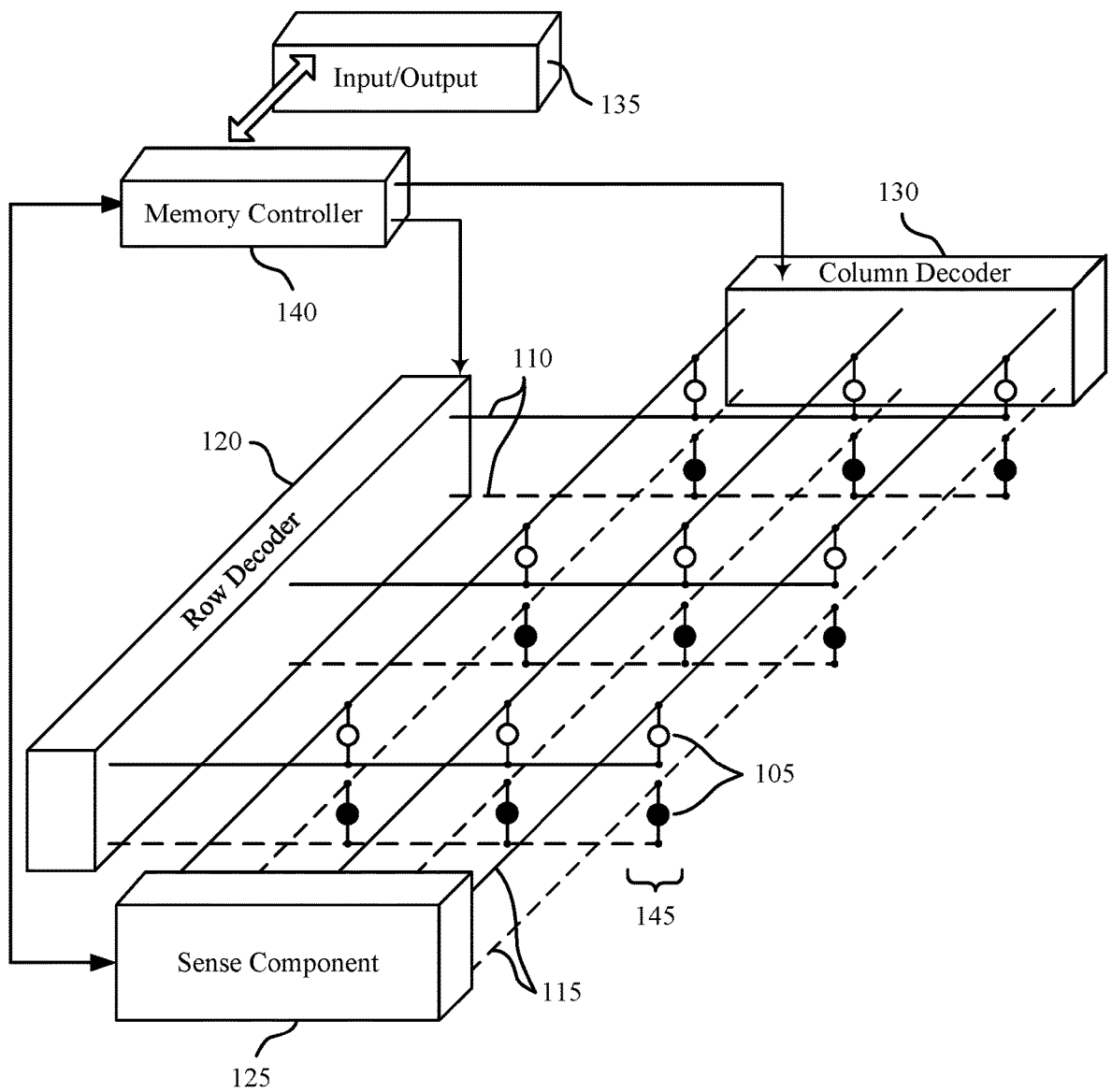
FIG. 1 illustrates an example of a memory array that supports cell voltage accumulation discharge in accordance with examples of the present disclosure.

In a bank of ferroelectric memory cells, memory cells within one or more sections (e.g., a of the bank of ferroelectric memory cells) may be accessed by applying a voltage to one or more access lines coupled with one or more sections containing memory cells.

In some examples, it may be desirable to access one memory cell, or a subset of memory cells, of a section. Stated another way, an access operation may be performed on a number of memory cells less than the total amount of memory cells in a particular section. Thus, during an access operation, some memory cells in a section may remain in an inactive (e.g., an "off") state while other cells in the section may be activated. When a particular subset of memory cells in a section are accessed, a voltage is applied to the access line and a corresponding charge is stored at a capacitor associated with the accessed cell. Despite some memory cells being in an inactive state during the access operation, the voltage applied to the common access line may disturb the inactive cell(s). Specifically, an unintended charge may be stored at a capacitor of an inactive cell, which may be referred to as cell leakage. Over time, cell leakage may result in one or more memory cells becoming corrupted. Thus it may be desirable to equilibrate all inactive memory cells (e.g., to 0V) to prevent cell leakage. By isolating one or more sections of memory cells and applying a voltage to an access line coupled with each cell of the isolated section, each memory cell within one or more sections may be equilibrated. Accordingly, such an operation may not require any substantial changes to be made to a driver associated with the memory array, and may require fewer control lines to discharge the inactive memory cells. Using a same driver structure and fewer control lines may result in a reduced power consumption of the memory array.

In a first example, a first section of ferroelectric memory cells may be isolated from a second section of ferroelectric memory cells. The sections may be isolated, for example, by activating one or more switching components coupled with one or more access lines coupled with or common to the first section and the second section. When isolated, an access device of each memory cell of the first section may be activated. The access devices may be activated, for example, by applying a voltage (e.g., from a voltage source) to an access line coupled with the first, isolated section. Upon activating the access devices, a capacitor associated with each memory cell of the section may be discharged. Accordingly, each memory cell of the isolated section may be equilibrated (e.g., set to a voltage, such as 0V). By equilibrating (e.g., equalizing) the cells, corruption of the cells may be prevented or at least delayed, while the memory array may utilizes less power.

In other examples, multiple sections of ferroelectric memory cells may be isolated concurrently or simultaneously. For example, a second section and third section of ferroelectric memory cells may be isolated. As described above, the sections may be isolated by activating one or more switching components coupled with one or more access lines coupled with or common to the sections. When isolated, an access device of each memory cell of the isolated sections may be activated by applying a voltage to one or more access lines coupled with the isolated section(s). Upon activating each access device, capacitors associated with each memory cell may be discharged which, as described above, may prevent or at least delay corruption of the cells.

Features of the disclosure introduced above are further described below at an exemplary memory array in the context of FIG. 1. An example of one or more circuits is then described in the context of FIG. 2. Specific examples of one or more memory devices are described in the context of FIGS. 3 through 5. These and other features of the disclosure are further illustrated by and described with reference to the device and circuit diagrams of FIGS. 6A and 6B, and the device and system diagrams of FIGS. 7 and 8, as well as flowcharts of FIGS. 9 through 12 that relate to cell voltage accumulation discharge.

FIG. 1 illustrates an example memory array 100 in accordance with various examples of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting access line 110 and digit line 115. Access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 1, each row of memory cells 105 is coupled with a single word line 110, and each column of memory cells 105 is coupled with a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105.

Memory array 100 may be a two-dimensional (2D) memory array or a three-dimensional (3D) memory array. A 3D memory array may include two-dimensional (2D) memory arrays formed on top of one another. This may increase the number of memory cells that may be placed or created on a single die or substrate as compared with 2D arrays, which in turn may reduce production costs or increase the performance of the memory array, or both. Memory array 100 may include any number of levels. Each level may be aligned or positioned so that memory cells 105 may be approximately aligned with one another across each level.

Each row of memory cells 105 may be coupled with a single word line 110, and each column of memory cells 105 may be coupled with a single digit line 115. In the example depicted in FIG. 1, memory array 100 includes one/two level/levels of memory cells 105 and may thus be considered a two-dimensional/three-dimensional memory array; however, the number of levels is not limited. By activating one word line 110 and one digit line 115 (e.g., applying a voltage to the word line 110 or digit line 115), a single memory cell 105 may be accessed at their intersection. Additionally, for example, in a 3D memory array, each level in a row may have common conductive lines such that each level may share word lines 110 or digit lines 115 or contain separate word lines 110 or digit lines 115. Thus in a 3D configuration one word line 110 and one digit line 115 of a same level may be activated to access a single memory cell 105 at their intersection. The intersection of a word line 110 and digit line 115, in either a 2D or 3D configuration, may be referred to as an address of a memory cell.

In some architectures, the logic storing device of a cell, e.g., a capacitor, may be electrically isolated from the digit line by a selection component. The word line 110 may be coupled with and may control the selection component. For example, the selection component may be a transistor and the word line 110 may be coupled with the gate of the transistor. Activating the word line 110 results in an electrical connection or closed circuit between the capacitor of a memory cell 105 and its corresponding digit line 115. The digit line may then be accessed to either read or write the memory cell 105.

In some examples, one or more sections of ferroelectric memory cells (e.g., memory cell 105) may be coupled with a word line 110. As described above, each memory cell may include a capacitor, and activating the word line 110 may result in an electrical connection between an activated memory cell and its corresponding digit line 115. When accessing one or more memory cells in a section, the voltage applied to word line 110 may disturb an inactive cell. Accordingly, it may be beneficial to periodically discharge the memory cells of a section to prevent one or more cells from being corrupted.

In some examples, a section of ferroelectric memory cells may be in contact with a plurality of first access lines (e.g., word lines 110). The plurality of first access lines may include a plurality of first switching components such that one or more sections may be isolated. In other examples, the plurality of first access lines may include a plurality of second switching components. Thus, in some examples, a combination of the first plurality of switching components and the second switching components may be deactivated to isolate one or more particular sections. For example, by activating the first plurality of switching components (along with or separate from activating a second plurality of switching components), a first section of ferroelectric memory cells may be isolated from a second section of ferroelectric memory cells. Upon isolating the section, a voltage may be applied to the section to activate an access device of each memory cell. Activating the access devices may result in a capacitor of each ferroelectric memory cell being discharged. Such an operation may equilibrate at least some or, in some cases, each cell within a section, and prevent the cells from being corrupted or affected due to excess charging of a respective capacitor. This operation may be implemented using existing access lines of the memory array 100, which may result in reduced power consumption to discharge the cells. Other lines (not shown in FIG. 1) may be present. For example, plate lines, described in more detail with reference to at least FIG. 2 herein, may be coupled to the memory cell 105.

Accessing memory cells 105 may be controlled through a row decoder 120, a column decoder 130 and, in some cases, a plate line decoder (not shown). For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed. Additionally or alternatively, as described above, each of word lines 110 WL_1 through WL_M may include a plurality of first switching components. The plurality of first switching components may be activated to isolate one or more sections of memory cells. By isolating a section of memory cells, a capacitor of each ferroelectric memory cell of the section may be discharged.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be coupled with or in electronic communication with column decoder 130 or row decoder 120.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written. In some examples, as described above, an unintended charge may be stored at a capacitor of an inactive cell during an access operation, which may degrade the cell over time. Accordingly, by periodically isolating a section of memory cells and discharging a capacitor associated with each cell, degradation of the cell may be prolonged or prevented. Additionally, memory array 100 may utilize less power by conducting such an operation using existing access lines.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures. For example, periodically isolating a section of memory cells and discharging a capacitor associated with each cell using existing access lines may delay or prevent degradation while consuming less power compared with other discharge operations.

The memory controller 140 may control the operation (e.g., read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

As discussed above, a section of ferroelectric memory cells may be isolated and a capacitor of each cell may subsequently be discharged. Accordingly, memory controller 140 may carry out or be utilized in one or more related operations. For example, memory controller 140 may initiate isolating a first section of ferroelectric memory cells from a second section of ferroelectric memory cells of the same bank. In some examples, memory controller 140 may initiate applying a voltage to the first section of ferroelectric memory cells. An access device of each memory cell of the first section of ferroelectric memory cells may be activated based at least in part on initiating applying the voltage. In other examples, a component (e.g., a memory controller 140) may determine a number of access operations that have been performed on the first section of ferroelectric memory cells (e.g., using a counter as one example). Initiating isolating the first section of ferroelectric memory cells, in some examples, may be based at least in part on the number of access operations exceeding a threshold. As discussed above, isolating a section of ferroelectric memory cells and discharging a capacitor associated with each cell may result in reduced power consumption by memory array 100.

Figure 2:
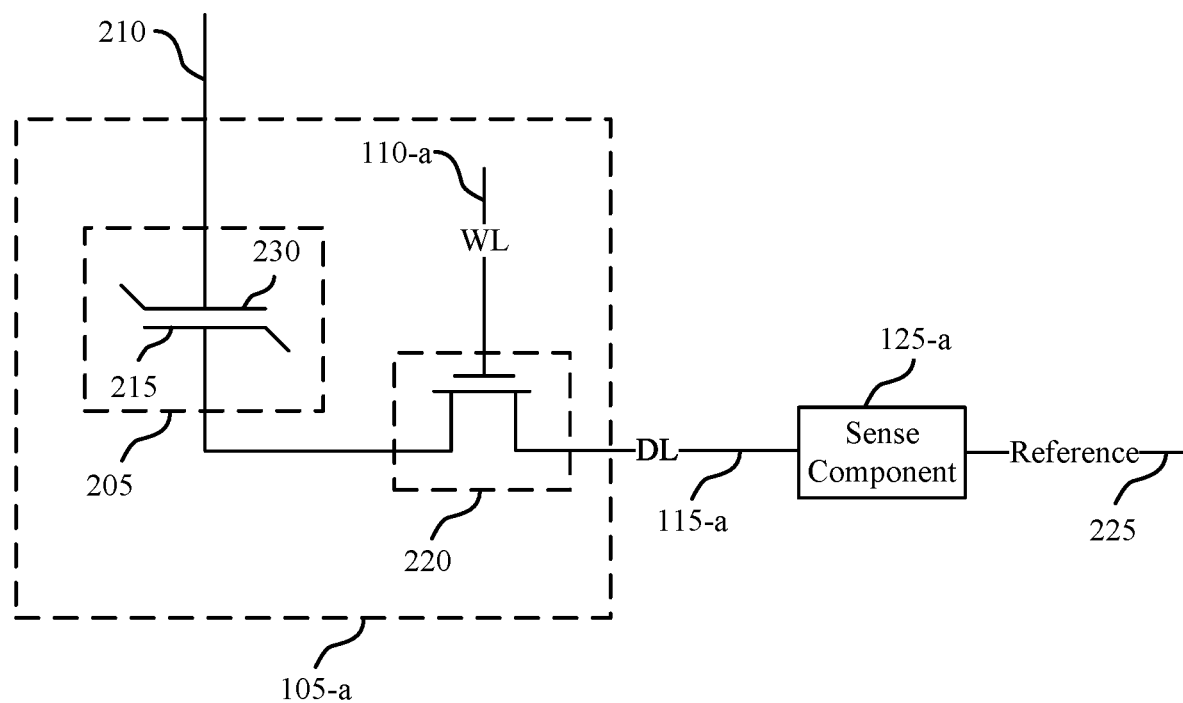
FIG. 2 illustrates an example circuit that supports cell voltage accumulation discharge in accordance with examples of the present disclosure.

FIG. 2 illustrates an example circuit 200 in accordance with various examples of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225. Cell plate 230 may be accessed via plate line 210 and cell bottom 215 may be accessed via digit line 115-a. As described above, various states may be stored by charging or discharging capacitor 205. In some examples, memory cell 105-a may be an example of one ferroelectric memory cell of a section of ferroelectric memory cells. For example, a bank of memory cells (e.g., of a memory array) may include multiple sections, and each section may include multiple cells. Accordingly, in some examples, word line 110-a may be coupled with one or more sections of ferroelectric memory cells.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be coupled with digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate the selection component 220; for example, a voltage applied to word line 110-a is applied to the transistor gate, coupling capacitor 205 with digit line 115-a.

In other examples, the positions of selection component 220 and capacitor 205 may be switched, such that selection component 220 is connected between plate line 210 and cell plate 230 and such that capacitor 205 is between digit line 115-a and the other terminal of selection component 220. In this example, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing plate line 210 and word line 110-a. Biasing plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate."

In some examples, capacitor 205 may discharge upon connection to digit line 115-a. As discussed above, a plurality of access lines (e.g., word lines 110-a) may be coupled with a plurality of sections of ferroelectric memory cells. By activating at least one switching component (e.g., a first plurality of switching components), a first section of ferroelectric memory cells may be isolated from a second section of ferroelectric memory cells. For example, memory cell 105-a may be included in a section of isolated ferroelectric memory cells. A voltage may be applied to memory cell 105-a, causing capacitor 205 to discharge. In some examples, a plurality of memory cells may be concurrently discharged, causing a capacitor of each memory cell to be equilibrated.

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 230 (through plate line 210) and cell bottom 215 (through digit line 115-a). To write a logic 0, cell plate 230 may be taken high, that is, a positive voltage may be applied to plate line 210, and cell bottom 215 may be taken low, e.g., virtually grounding or applying a negative voltage to digit line 115-a. The opposite process is performed to write a logic 1, where cell plate 230 is taken low and cell bottom 215 is taken high. In some examples, the voltage applied across capacitor 205 may originate from a single voltage source (e.g., VDD). By isolating a section of ferroelectric memory cells, a voltage may be applied from the voltage source to activate an access component of each memory cell of the isolated section. As described above, applying the voltage may result in each capacitor being discharged (e.g., discharged to ground), causing each capacitor of the isolated section to be equilibrated.

Figure 3:
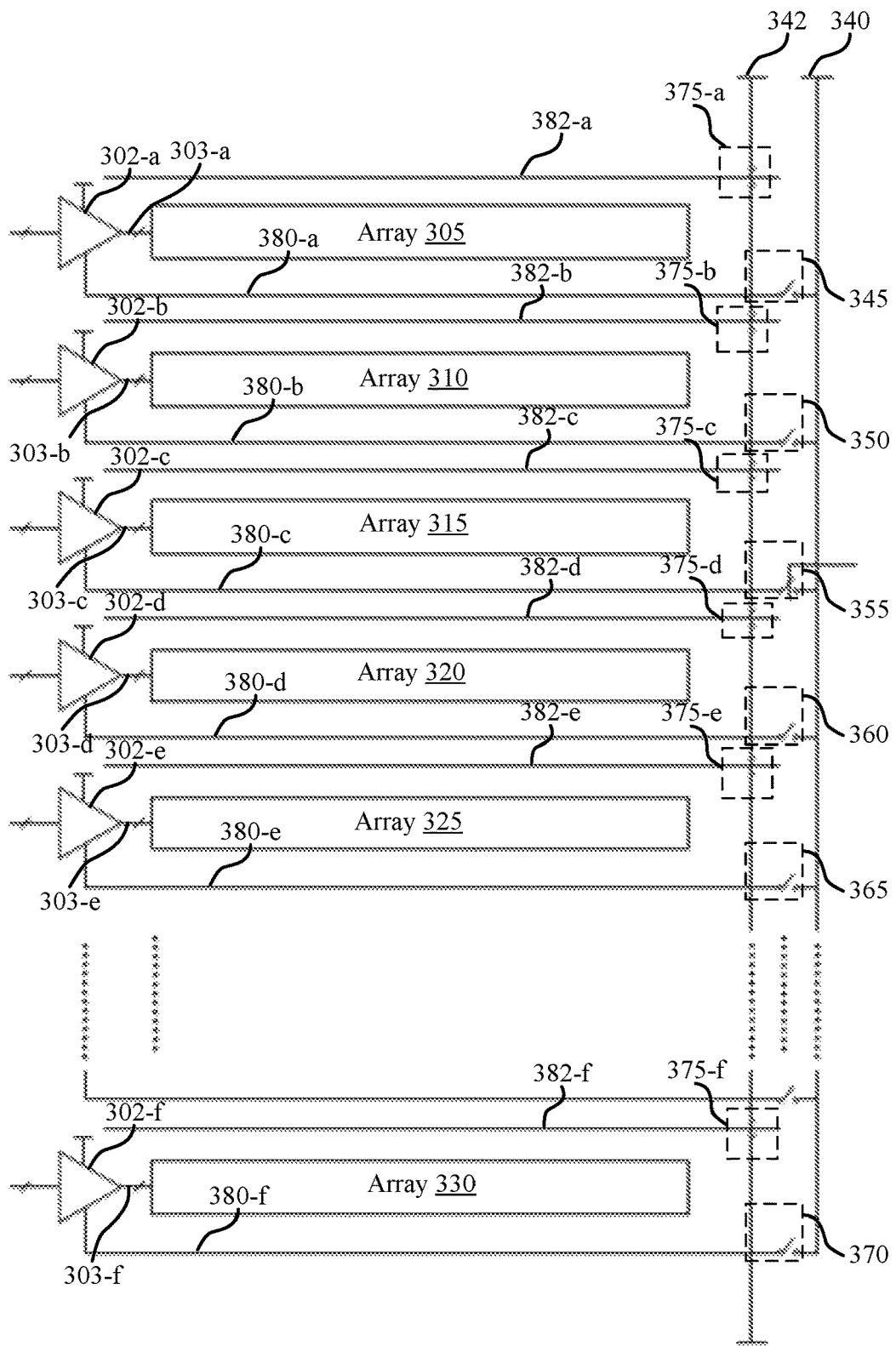
FIGS. 3 through 5 illustrate example apparatus diagrams that support cell voltage accumulation in accordance with examples of the present disclosure.

FIG. 3 illustrates an example memory device 300 in accordance with various examples of the present disclosure. Memory device 300 may include a plurality of arrays 305, 310, 315, 320, 325, and 330 of a memory bank. In some cases, each array 305, 310, 315, 320, 325, and 330 may be coupled with a group of respective drivers (e.g., drivers 302-a, 302-b, 302-c, 302-d, 302-e, and 302-f). A combination of an array and a respective group of drivers (e.g., driver 302-a and array 305) may be referred to as a section. Additionally or alternatively, each array may be coupled with a group of respective drivers via a respective access line (e.g., access line 303-a, 303-b, 303-c, 303-d, 303-e, and 303-f). Each of access lines 303-a, 303-b, 303-c, 303-d, 303-e, and 303-f may be an example of a word line 110 as described with reference to FIG. 1 and may be coupled with a single driver.

In some examples, each driver may be coupled with a negative word line (e.g., negative word line 380-a, 380-b, 380-c, 380-d, 380-e, and 380-f). Each negative word line may be coupled with a voltage source 340 (e.g., VDD) through a respective switching component (e.g., switching components 345, 350, 355, 360, 365, and 370). Additionally or alternatively, each array (e.g., array 305, 310, 315, 320, 325, and 330) may be isolated from one or more additional arrays via section enable lines 382-a, 382-b, 382-c, 382-d, 382-e, and 382-f. Each section enable line may be coupled with a negative voltage source 342 (e.g., VNWL) via a respective switching component (e.g., switching components 375-a, 375-b, 375-c, 375-d, 375-e, and 375-f). For example, array 310 (e.g., along with driver 302-b) may be isolated from arrays 305 and 315 by deactivating switching components 375-b and 375-c. Switching components 375-b and 375-c may be deactivated by section enable lines 382-b and 382-c, respectively. When switching components 375-b and 375-c are deactivated, switching component 350 may be activated to couple driver 302-b with voltage source 340. When coupled with voltage source 340, driver 302-b may drive access line 303-b to VDD, which may result in the access devices of memory array 310 being activated thereby discharging the memory cells associated with the array 310.

As described above, memory device 300 may include sections of ferroelectric memory cells (e.g., a section including array 315 and driver 302-c). Each section may include an array of ferroelectric memory cells (e.g., a plurality of ferroelectric memory cells) that may include a capacitor and an access device. Each of the sections may be coupled with a respective access line and/or negative word line. Each negative word line may be coupled with the voltage source 340 via a switching component. For example, driver 302-a may be coupled with voltage source 340 via switching component 345, driver 302-b may be coupled with voltage source 340 via switching component 350, driver 302-c may be coupled with voltage source 340 via switching component 355, driver 302-d may be coupled with voltage source 340 via switching component 360, driver 302-e may be coupled with voltage source 340 via switching component 365, and driver 302-f may be coupled with voltage source 340 via switching component 370. In order to apply a voltage to one or more memory cells of a respective memory array, one or more switching components may be activated and/or deactivated. For example, to apply a voltage to the ferroelectric memory cells of array 305, switching components 375-a and 375-b may be deactivated to isolate array 305 from negative voltage source 342, and switching component 345 may be activated to couple negative word line 380-a with voltage source 340. In other examples, when switching components 375-a and 375-b are activated, and switching component 345 is deactivated, the access devices of the memory cells of array 305 may remain in an idle state.

In some examples, at least some of the ferroelectric memory cells may include a capacitor (e.g., capacitor 205 as described with reference to FIG. 2) and an access device. As described above, during an access operation a voltage may be applied to an access line coupled with a plurality of memory cells (e.g., an array). Each memory cell may include an access device to prevent a respective capacitor from inadvertently discharging (e.g., leaking) onto the access line (e.g., the digit line). Stated another way, a memory cell may include an access device to ensure that a capacitor stores a desired charge. In some examples, an access device may be or may include a transistor. Accordingly a capacitor of a memory cell may be discharged by activating a respective access device.

As described above, it may be desirable to discharge a capacitor of one or more ferroelectric memory cells to prevent degradation of the data associated with a respective cell. In some examples, one or more memory cells of a section (e.g., array 310 and driver 302-b) may be discharged by isolating the section and discharging one or more cells within the section. For example, array 310 may be isolated (e.g., isolated from array 305 and array 315) by deactivating switching components 375-b and 375-c. Deactivating switching components 375-b and 375-c may disconnect negative word line 380-b from negative voltage source 342. In some examples, array 310 may be isolated based in part on deactivating a plurality of switching components (e.g., switching components 375-b and 375-c). Switching components 375-b and 375-c may be deactivated, for example, via a signal transmitted via section enable lines 382-b and 382-c, respectively. In other examples, array 310 may be isolated based in part on deactivating one switching component— e.g., switching component 375-b or switching component 375-c. In some examples, switching component 375-b may include one or multiple switching components and switching component 375-c may include one or multiple switching components. As described above, driver 302-*b* may drive access lines 303-*b*, which may result in the access devices of array 310 being kept in an "off" position. Thus, by isolating array 310 (e.g., from array 305 and array 315), negative word line 380-*b* may be coupled with voltage source 340 and the access devices of each memory cell of array 310 may be activated.

In some examples, memory device 300 may incorporate one or more drivers (e.g., drivers 302-*a* and 302-*c*) to ensure that the non-isolated sections remain driven (e.g., that access devices of the respective memory cells remain in an idle state). For example, activating switching components 375-*b* and 375-*c* may isolate array 310. Accordingly, array 305 may remain driven by driver 302-*a*, and array 315 may remain driven by driver 302-*c*. Thus the access devices of arrays 305 and 315 may remain an idle state when the access devices of array 310 are discharged. Accordingly, the access devices of non-isolated sections may remain in an inactive (e.g., "off") position when one or more sections are isolated. Thus, as described above, incorporating multiple drivers may ensure that non-isolated sections remain driven while enabling activation of sections below and above the one or more isolated sections.

After isolating array 310, switching component 350 may be activated to connect negative word line 380-*b* to voltage source 340. Accordingly, a voltage (e.g., VDD) may be applied to array 310. Application of the voltage may activate an access device of at least one ferroelectric memory cell of array 310. Thus each memory cell of array 310 may be discharged (e.g., discharged to ground). Stated another way, applying a voltage to array 310 may result in each access device being in activated (e.g., in an "on" position). When an access device is activated position, a capacitor of each memory cell may be discharged, resulting in each memory cell being equilibrated to 0V. After discharging the cells, array 310 may be recoupled with negative voltage source 342 by activating switching components 375-*b* and 375-*c*, and deactivating switching component 350. Accordingly, the memory cells of array 310 may be coupled with (e.g., driven by) driver 302-*b*, resulting in each access device of the section being deactivated (e.g., kept in an "off" position).

In other examples, multiple sections may be isolated concurrently. For example, memory device 300 may include a plurality of switching components coupled with a plurality of negative word lines and a plurality of section enable lines. Thus each section may be individually isolated or isolated as part of a group of sections. For example, arrays 310 and 315 may be concurrently isolated by deactivating a switching component that is directly above array 310 (e.g., between array 305 and array 310) and a switching component that is directly below array 315 (e.g., between array 315 and array 320).

Once isolated, a voltage (e.g., VDD) may be applied to array 310 and array 315 from voltage source 340 by activating switching components 350 and 355, respectively. Accordingly, a voltage (e.g., VDD) may be applied to array 310 and array 315. Application of the voltage may activate an access device of each memory cell of both arrays. Thus each memory cell of array 310 and array 315 may be discharged (e.g., discharged to ground). After discharging the cells, array 310 and array 315 may be recoupled with negative voltage source 342 by activating the previously-deactivated switching components (e.g., between arrays 305 and 310 and arrays 315 and 320). Accordingly, the memory cells of arrays 310 and 315 may be reconnected (e.g., driven by) drivers 302-*b* and 302-*c*, resulting in each access device of the sections being deactivated (e.g., kept in an "off" position).

Figure 4:
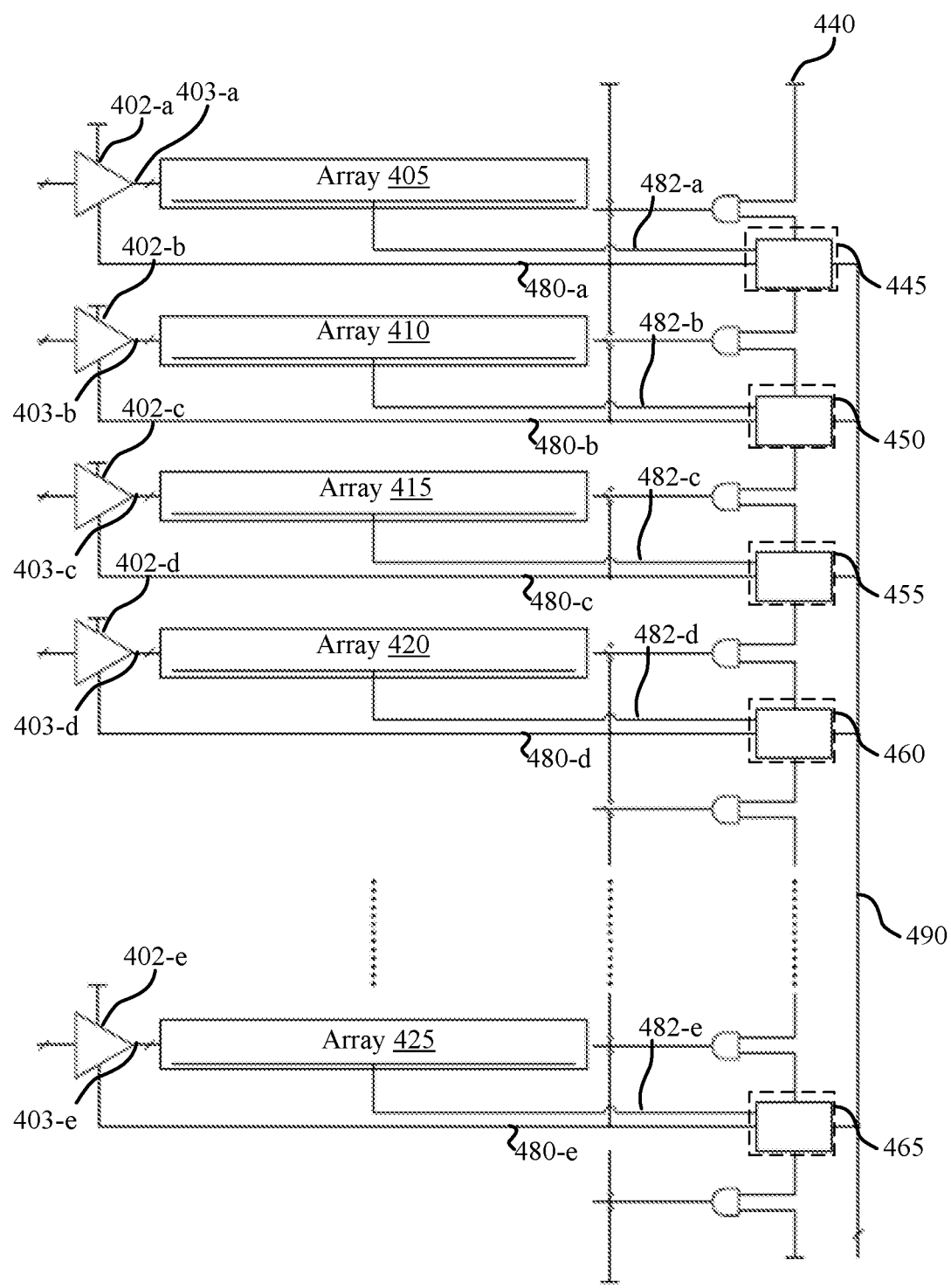

FIG. 4 illustrates an example memory device 400 in accordance with various examples of the present disclosure. Memory device 400 may include a plurality of arrays 405, 410, 415, 420, and 425 of a memory bank. Each array may be coupled with a driver (e.g., drivers 402-*a*, 402-*b*, 402-*c*, 402-*d*, and 402-*e*). In some examples, each driver may be coupled with a respective array via a word line (e.g., word lines 403-*a*, 403-*b*, 403-*c*, 403-*d*, and 403-*e*). Additionally or alternatively, each driver may be coupled with a respective negative word line (e.g., negative word lines 480-*a*, 480-*b*, 480-*c*, 480-*d*, and 480-*e*), and each negative word line may be coupled with a respective equalization component (an EQ component; e.g., equalization components 445, 450, 455, 460, and 465), and each EQ component may be coupled with equalization command line 490. Additionally or alternatively, each array may include or may be coupled with a plate line (e.g., plate lines 482-*a*, 482-*b*, 482-*c*, 482-*d*, and 482-*e*). As described above with reference to FIG. 3, a combination of an array and a respective driver (e.g., array 405 and driver 402-*a*) may be referred to as a section.

As described above, drivers 402-*a* and 402-*b* may be coupled with access lines 403-*a* and 403-*b*, respectively. Drivers 402-*a* and 402-*b* may each be coupled with a negative word line (e.g., negative word line 480-*a* and negative word line 480-*b*) and may drive access lines 403-*a* and 403-*b*, which may result in the access devices of a particular section (e.g., of a driven section) being deactivated (e.g., kept in an "off" position). When deactivated, an access device may prevent an associated capacitor from discharging.

In some examples, each array of memory device 400 may include one or more memory cells (e.g., memory cell 105 as described with reference to FIG. 1) that may include a capacitor and an access device. Each of the arrays may be coupled with a respective access line, a respective driver, a respective negative word line, and a respective EQ component. In some examples, each array may include a plate line (not shown) coupled with a respective EQ component. For example, array 405 may be coupled with EQ component 445, array 410 may be coupled with EQ component 450, array 415 may be coupled with EQ component 455, array 420 may be coupled with EQ component 460, and array 425 may be coupled with EQ component 465. In some examples a respective EQ component may apply a voltage to one or more memory cells of an array. In some examples, this application of voltage may be based on a number of access operations previously performed on one or more memory cells of a respective array. For example, to apply a voltage to the ferroelectric memory cells of array 405, EQ component 445 may first determine that a threshold number of access operations have been performed on one or more memory cells of array 405. In other examples a memory controller (e.g., memory controller 140 as described with reference to FIG. 1) may first determine that a threshold number of access operations have been performed on one or more memory cells of array 405.

In some examples, each ferroelectric memory cell may include a capacitor (e.g., capacitor 205 as described with reference to FIG. 2) and an access device. During an access operation a voltage is applied to an access line coupled with a plurality of memory cells. Because each memory cell may include an access device, and an access device may ensure that a capacitor stores a desired charge when in an "off"

position, a capacitor of a memory cell may be discharged by activating (e.g., turning "on") a respective access device.

In some examples, it may be desirable to discharge a capacitor of one or more ferroelectric memory cells to prevent degradation of the cell. In some examples, one or more memory cells of an array (e.g., array 415) may be discharged by isolating the section and discharging one or more cells within the section. In some examples, isolation of one or more sections may be initiated by a command received at a respective EQ component from equalization command line 490. Accordingly, for example, array 415 and driver 402-*c* (e.g., a section including array 415 and driver 402-*c*) may be isolated (e.g., isolated from array 410 and array 420) by EQ components 450 and 460, respectively.

In some examples, an array (e.g., array 415) may be isolated based on a number of access operations associated with the array. For example, a relatively high number of access operations associated with a section may indicate that one or more capacitors of the section are nearing an overcharged state. Accordingly, an EQ component or, in some cases a memory controller (e.g., memory controller 140 as described with reference to FIG. 1) may monitor a number of access operations associated with an array. For example, when an access operation occurs on one or memory cells of an array, a respective access component may increment a counter based on the occurrence of the operation. In some examples, a respective EQ component may monitor the number of access operations associated with an array in response to receiving an equalization command from equalization command line 490.

For example, EQ component 455 may receive an equalization command from equalization command line 490 and may subsequently determine a number of access operations that have been performed on array 415. Based on the number of access operations exceeding a predetermined threshold (e.g., 10 access operations without a discharge operation), EQ component 455 may isolate array 415. In other examples, EQ component 455 may transmit an indication to a memory controller to isolate array 415.

After isolating array 415, EQ component 455 may discharge a plate line (not shown) coupled with each memory cell of the section. The plate line may be discharged, for example, to a capacitor associated with (e.g., located within) EQ component 455. The resulting charge stored at the capacitor may then be applied to array 415. Application of the voltage resulting from the stored charge may activate an access device of each memory cell of array 415. Thus each memory cell of array 415 may be discharged (e.g., discharged to ground).

Stated another way, applying a voltage to array 415 may result in each access device being activated (e.g., in an "on" position). When an access device is activated, a capacitor of each memory cell may be discharged, resulting in each memory cell being equilibrated to 0V. After discharging the cells, array 415 may be recoupled with a negative voltage source (e.g., negative voltage source 342 as described with reference to FIG. 3), for example, by EQ component 455 activating one or more switching components. Accordingly, the memory cells of array 415 may be reconnected (e.g., driven by) to the negative voltage source, resulting in each access device of the section being kept in an "off" position.

As described above, multiple sections may be isolated concurrently. For example, memory device 400 may include a plurality of switching components. Accordingly, each section may be individually isolated or isolated as part of a group of sections by activating and/or deactivating one or more switching components.

For example, arrays 410 and 415 may be concurrently isolated upon EQ components 450 and 455, respectively, receiving an equalization command from equalization command line 490. EQ components 450 and 455 may then deactivate a switching component that is directly above array 410 (e.g., between array 405 and array 410) and a switching component that is directly below array 415 (e.g., between array 415 and array 420). Additionally or alternatively, a switching component that is directly above array 410 (e.g., between array 405 and array 410) may be deactivated and an access component that is directly below array 415 (e.g., between array 415 and array 420) may be deactivated. This may isolate arrays 410 and 415 (e.g., from array 305 and array 320).

Once isolated, EQ components 450 and 455 may discharge the plate lines of arrays 410 and 415, respectively. The plate lines may be discharged to a capacitor associated with each EQ component. The resulting charge stored at the capacitors may then be applied to arrays 410 and 415 to activate the access devices of each respective section. Accordingly, each memory cell of array 410 and 415 may be discharged (e.g., discharged to ground). After discharging the cells, array 410 and array 415 may be recoupled with a negative voltage source. Accordingly, the memory cells of array 410 and array 415 may be driven to a respective voltage (e.g., VNWL), resulting in each access device of the sections being kept in an "off" position.

Figure 5:
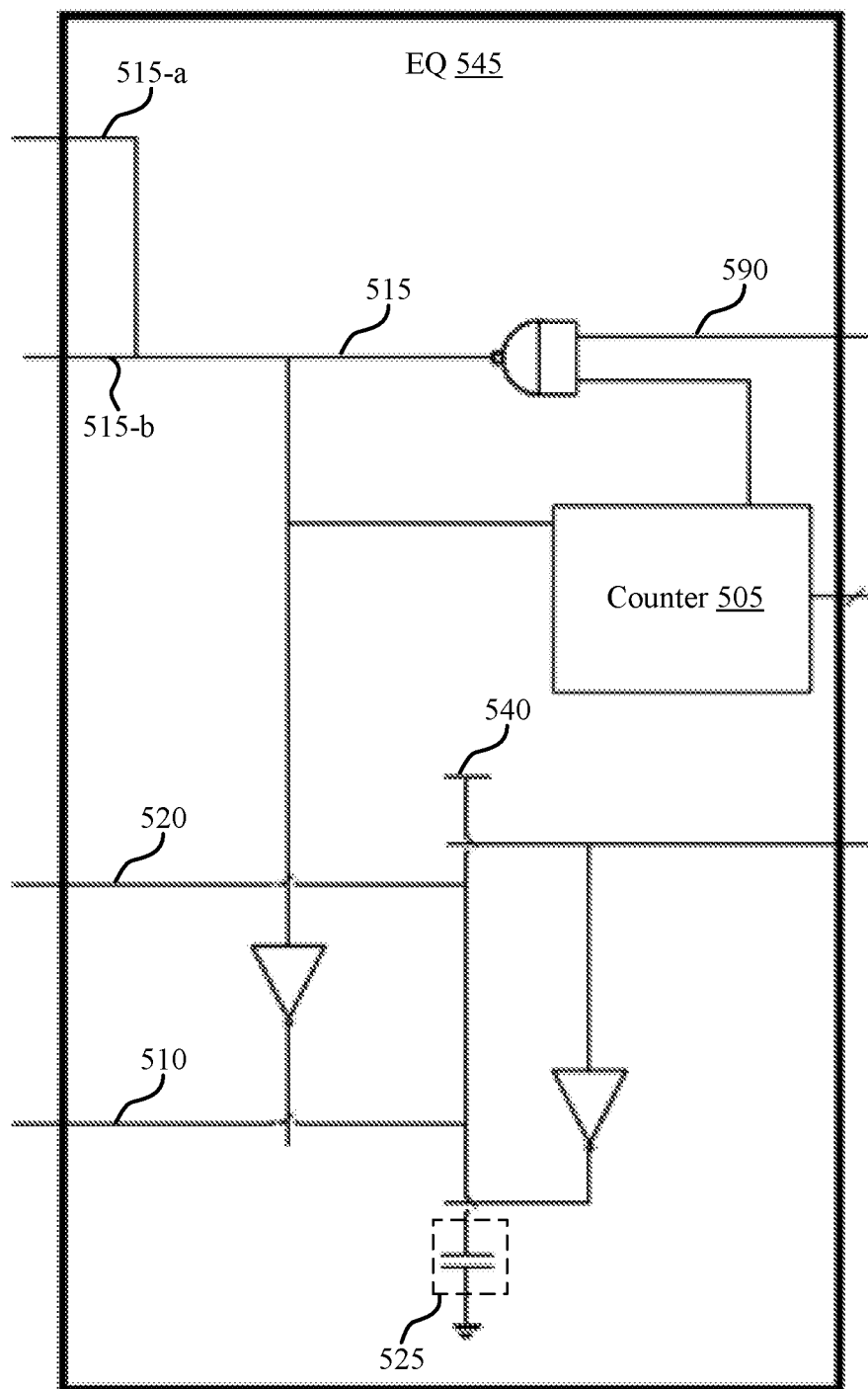

FIG. 5 illustrates an example memory device 500 in accordance with various examples of the present disclosure. Memory device 500 may include EQ component 545, which may be an example of an EQ component (e.g., EQ component 445) as described with reference to FIG. 4. In some examples, EQ component 545 may include a counter 505, a plate discharge line 510, a switching component activation line 515 (e.g., 515-*a* and 515-*b*), a voltage application line 520, a capacitor 525, a voltage source 540, an equalization command line 590, and a signal control line (not shown).

As described above, an EQ component (e.g., EQ component 545) may monitor a number of access operations associated with a particular array of ferroelectric memory cells. For example, EQ component 545 may monitor a number of access operations associated with one array (e.g., array 415 as described with reference to FIG. 4). In some examples, counter 505 may be incremented based on the occurrence of an access operation associated with a respective section. Thus an access device of each memory cell of the section may be discharged based on the counter reaching a threshold (e.g., once a predetermined number of access operations occur).

In some examples, EQ component 545 may determine a number of access operations associated with an array in response to receiving an equalization command from equalization command line 590. For example, EQ component 545 may receive an equalization command from equalization command line 590 and may subsequently determine a number of access operations that have been performed on a respective section. Based on a determination that the number of access operations exceeds a predetermined threshold, EQ component 545 may isolate the section. The section may be isolated, for example, based on EQ component 545 transmitting a command to a first set of switching components via switching component activation line 515-*a* and transmitting a command to a second set of switching components via switching component activation line 515-*b*.

During each access operation, for example, a charge accumulation on a respective plate line may be recycled to capacitor 525 to be used in an equalization operation associated with the memory cell. Thus EQ component 545 may discharge a plate line coupled with each memory cell of the isolated array. The plate line may be discharged, for example, to a capacitor 525 via plate discharge line 510. Thus plate discharge line 510 may receive a voltage (e.g., a first voltage) from the plate line and a respective charge may be stored at capacitor 525. In some examples, the charge stored at capacitor 525 will ultimately be used to activate the switching components associated with the ferroelectric memory cells of the isolated section. However, in some examples, the charge stored at capacitor 525 may be insufficient to activate each of the access devices (e.g., due to leakage of capacitor 525). In such an example, voltage source 540 may supplement (e.g., fill) capacitor 525 to ensure that the stored charge is sufficient to activate each access device of the isolated section.

After receiving an equalization command that isolates a respective section, capacitor 525 may be discharged to voltage application line 520. Application of the voltage resulting from the charge stored at capacitor 525 (e.g., via voltage application line 520) may activate an access device of each memory cell of the isolated array. Accordingly, each memory cell of the array may be discharged (e.g., discharged to ground). After discharging the cells, the isolated array may be recoupled with a negative word line voltage source 442 via switching component activation lines 515-*a* and 515-*b*. For example, switching component activation line 515-*a* may transmit a command to a first set of switching components and switching component activation line 515-*b* may transmit a command to a second set of switching components to reconnect the array.

In other examples (not shown), EQ component 545 may be coupled with a plurality of arrays of memory cells. Accordingly, EQ component 545 may include multiple counters, multiple capacitors, multiple activation lines, and multiple voltage sources to support isolating one or more arrays of ferroelectric memory cells, and concurrently discharging the memory cells of each isolated array.

Figure 6A:
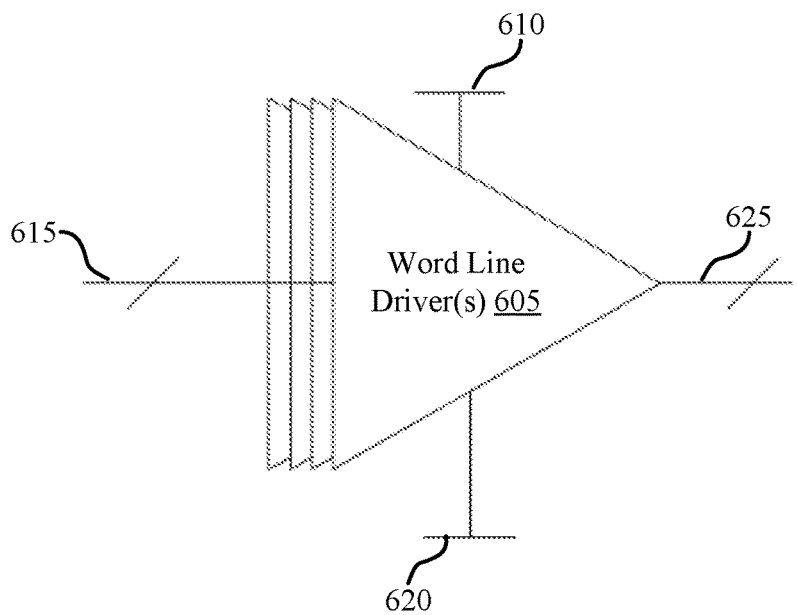
FIGS. 6A and 6B illustrate example devices and circuits that support cell voltage accumulation discharge in accordance with examples of the present disclosure.

FIG. 6A illustrates an example memory device 600-*a* in accordance with various examples of the present disclosure. Memory device 600-*a* may include one or more word line drivers 605. In some examples, each section of ferroelectric memory cells (e.g., array 305 and driver 302-*a* as described with reference to FIG. 3; array 405 and driver 402-*a* as described with reference to FIG. 4) may be coupled with an array word line 625 of word line driver 605. In some examples, each word line driver 605 may be coupled with ground (e.g., 0V) 610, a voltage source 615, and a negative word line 620 in the idle state.

As described above, each section of a memory array may include a plurality of ferroelectric memory cells that may each include a capacitor and an access device. In some examples, a word line driver 605 may drive array word line 625 with a negative voltage value (e.g., from negative word line 620). For example, array word line 625 may be coupled with an array of memory cells. Word line driver 605 may drive array word line 625 with a negative voltage value from negative word line 620, which may result in each access device of the driven section being maintained as deactivated (e.g., in an "off" position). When deactivated, an access device may prevent an associated capacitor from discharging.

In some examples, one or more sections of a memory array may be isolated (e.g., isolated from one or more additional sections). For example, a section may be isolated by ceasing application of a negative voltage value from negative word line 620. When isolated, word line driver 605 may apply a voltage (e.g., from voltage source 340 as described with reference to FIG. 3) to array word line 625. Each driver may have a dedicated input control signal 615 that may activate a respective access line during an access operation. Each control signal 615 may be deactivated when the memory array is idle. As described above, applying a voltage to a word line coupled with a plurality of memory cells may activate an access device of each memory cell. Subsequently, for example, word line driver 605 may activate (e.g., via negative word line 620 coupled with VDD) array word line 625, which may result in the access device of each memory cell being discharged. In some examples, this may be referred to as equilibrating the memory cells of a section. In some examples, the isolated section may be recoupled with one or more access lines, and word line driver 605 may drive array word line 625 with a negative voltage value from negative word line 620 coupled with a supply voltage (e.g., voltage source 342 as described with reference to FIG. 3) to keep each access device in an "off" position.

Figure 6B:
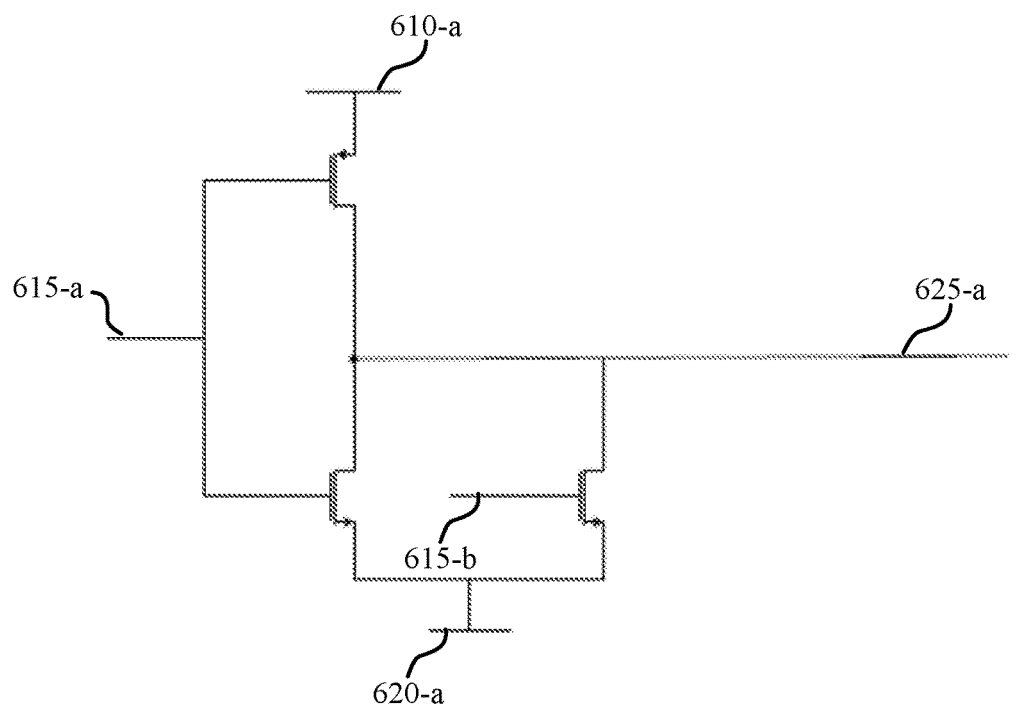

FIG. 6B illustrates an example circuit 600-*b* in accordance with various examples of the present disclosure. Circuit 600-*b* may be used to activate and deactivate word line 625-*a*. The driver circuit may, in some examples, isolate one or more sections of ferroelectric memory cells, and discharge the cells of the isolated array as described herein. In some examples, each array of ferroelectric memory cells (e.g., array 305 as described with reference to FIG. 3; array 405 as described with reference to FIG. 4) may be coupled with an array word line 625-*a*. In some examples, circuit 600-*b* may be an example of word line driver 605 as described with reference to FIG. 6A, and may include signal 610-*a* that may be a ground signal (e.g., 0V) in the idle state, control signal 615-*a* and 615-*b*, and negative word line 620-*a*.

As described above, each array of a memory array may include a plurality of ferroelectric memory cells that may include a capacitor and an access device. In some examples, circuit 600-*b* may be utilized to apply a negative voltage value (e.g., from negative word line 620-*a*) to array word line 625-*a*. A negative voltage value may be applied to word line 625-*a* from negative word line 620-*a*, which may result in each access device of a particular being kept in an "off" position. As described above, when in an "off" position, an access device may prevent an associated capacitor from discharging.

In some examples, a section of ferroelectric memory cells may be isolated by ceasing application of a negative voltage value from negative word line 620-*a*. When isolated, a voltage (e.g., from voltage source 340 as described with reference to FIG. 3) may be applied to array word line 625-*a* while control signal 615-*a* is activated and control signal 610-*a* is deactivated (e.g., grounded). Applying a voltage to a word line coupled with a plurality of memory cells may activate an access device of each memory cell. Subsequently, for example, array word line 625-*a* may be coupled to VDD via a supply voltage (e.g., voltage source 340 as described with reference to FIG. 3), which may result in the access device of each memory cell being discharged. In some examples, this may be referred to as equilibrating the memory cells of a section. In some examples, the isolated section may be recoupled with one or more access lines, a word line 625-*a* may be driven with a negative voltage value from negative word line 620-*a* to keep each access device in an "off" position.

Figure 7:
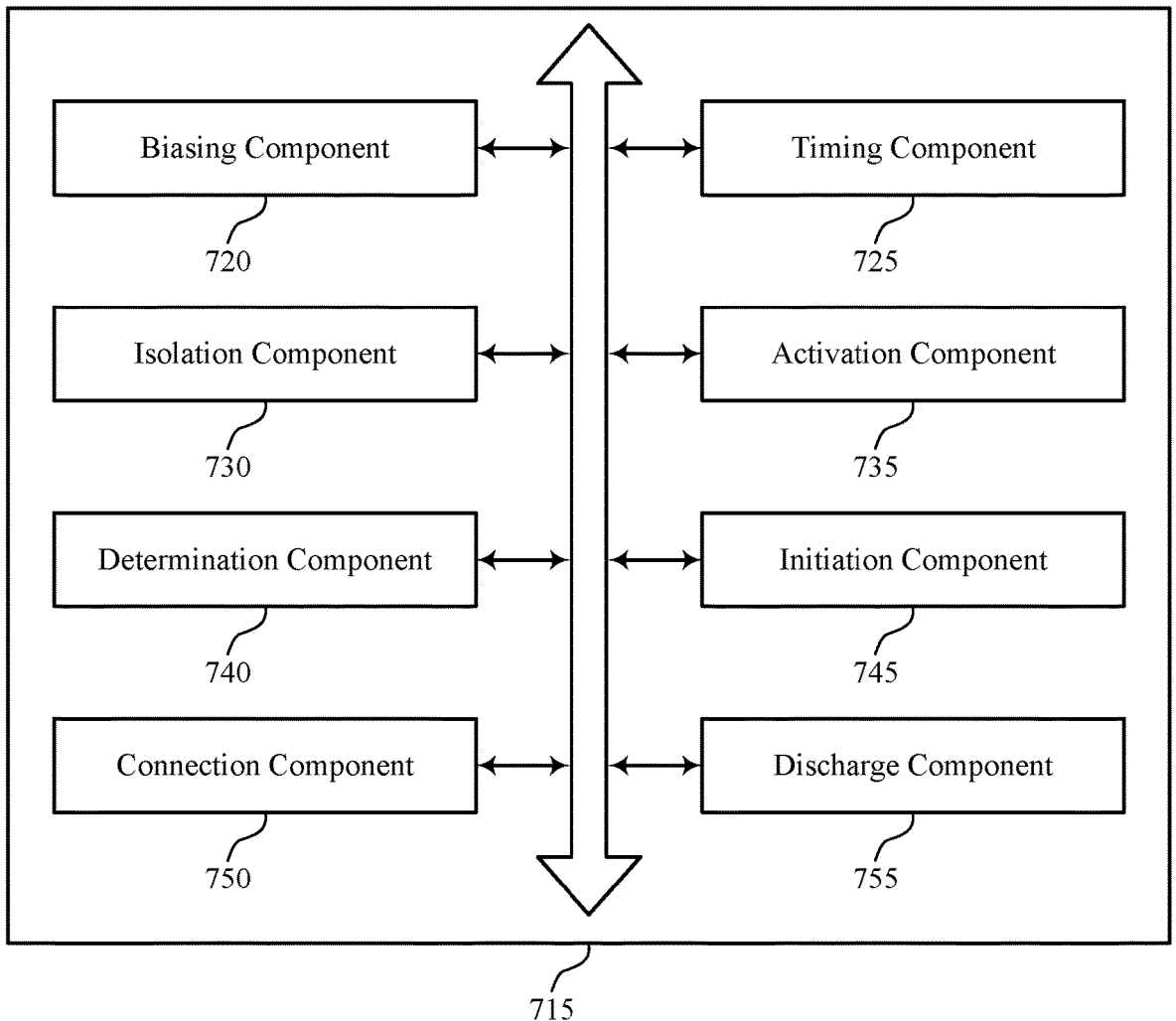
FIG. 7 shows a block diagram of a device that supports cell voltage accumulation discharge in accordance with examples of the present disclosure.

FIG. 7 shows a block diagram 700 of a memory controller 715 that supports cell voltage accumulation discharge in accordance with examples of the present disclosure. The memory controller 715 may be an example of aspects of a memory controller 815 described with reference to FIG. 1. The memory controller 715 may include biasing component 720, timing component 725, isolation component 730, activation component 735, determination component 740, initiation component 745, connection component 750, and discharge component 755. Each of these modules may communicate, directly or indirectly, with one another (e.g., via one or more buses).

Isolation component 730 may isolate a first section of ferroelectric memory cells from a second section of ferroelectric memory cells of a bank of sections by deactivating a set of first switching components coupled with a set of first access lines. In some examples, the set of first access lines may be coupled with the first section of ferroelectric memory cells and the second section of ferroelectric memory cells of the bank of sections. In some examples, isolation component 730 may isolate the first section of ferroelectric memory cells and the second section of ferroelectric memory cells from a third section of ferroelectric memory cells of the bank of sections by deactivating the set of first switching components coupled with the set of first access lines.

In other examples, isolation component 730 may isolate a third section of ferroelectric memory cells from the second section of ferroelectric memory cells concurrent with isolating the first section of memory cells from the second section of ferroelectric memory cells of the bank of sections. Additionally or alternatively, isolation component 730 may isolate the first subset of ferroelectric memory cells from a second subset of ferroelectric memory cells of the bank based on determining the number of access operations.

In other examples, isolation component 730 may isolate the second subset of ferroelectric memory cells from a third subset of ferroelectric memory cells of the same bank of ferroelectric memory cells based on determining the number of access operations. Isolation component 730 may isolate the first subset of ferroelectric memory cells is based on the counter exceeding a threshold. In some examples, isolation component 730 may isolate the first subset of ferroelectric memory cells by deactivating a set of switching components coupled with an access line in electronic communication with a set of subsets of ferroelectric memory cells of the same bank of ferroelectric memory cells.

Activation component 735 may activate an access device of each memory cell of the first section of ferroelectric memory cells by applying a voltage from a voltage source to the first section of ferroelectric memory cells after isolating the first section of ferroelectric memory cells. In some examples, activation component 735 may activate the access device of each ferroelectric memory cell of the first section of ferroelectric memory cells by activating at least one second switching component coupled with the voltage source and the first section of ferroelectric memory cells before applying the voltage to the first section of ferroelectric memory cells. Additionally or alternatively, activation component 735 may activate the access device of each ferroelectric memory cell of the first section of ferroelectric memory cells and the second section of ferroelectric memory cells by applying the voltage to the first section of ferroelectric memory cells and the second section of ferroelectric memory cells after isolating the first section of ferroelectric memory cells and the second section of ferroelectric memory cells.

In some examples, activation component 735 may activate the access device of each ferroelectric memory cell of the first section of ferroelectric memory cells by activating at least one third switching component coupled with the voltage source and the first section of ferroelectric memory cells before applying the voltage to the first section of ferroelectric memory cells. In some examples, activating the access device of each ferroelectric memory cell of the second section of ferroelectric memory cells by activating at least one fourth switching component coupled with the voltage source and the second section of ferroelectric memory cells before applying the voltage to the second section of ferroelectric memory cells. In other examples, activation component 735 may activate an access device of each ferroelectric memory cell of the third section of ferroelectric memory cells concurrent with activating the access device of each memory cell of the first section of ferroelectric memory cells. Activation component 735 may activate an access device by applying the voltage to the third section of ferroelectric memory cells while the first section of ferroelectric memory cells and the third section of ferroelectric memory cells are isolated from the second section of ferroelectric memory cells.

In some examples, activation component 735 may activate the access device of each ferroelectric memory cell of the first section of ferroelectric memory by shorting an isolated portion of the set of first access lines to the voltage source coupled with the set of first access lines. In other examples, activation component 735 may activate an access device of each memory cell of the first subset of ferroelectric memory cells based on isolating the first subset of ferroelectric memory cells. Additionally or alternatively, activation component 735 may activate an access device of each ferroelectric memory cell of the second subset of ferroelectric memory cells in response to isolating the second subset of ferroelectric memory cells. In some examples, activation component 735 may activate the access device of each ferroelectric memory cell of the first subset of ferroelectric memory cells based on an adjustment of a voltage of the first subset of ferroelectric memory cells.

Determination component 740 may determine a number of access operations that have been performed on a first subset of ferroelectric memory cells of a bank and determine a number of access operations that have been performed on the second subset of ferroelectric memory cells. In some cases, the number of access operations that have been performed on the first subset of ferroelectric memory cells is determined using a counter.

Initiation component 745 may initiate applying a voltage to the first section of ferroelectric memory cells. In some examples, an access device of each memory cell of the first section of ferroelectric memory cells may be activated based on initiating applying the voltage.

Connection component 750 may couple the first section of ferroelectric memory cells to the set of first access lines after activating the access device of each memory cell of the first section of ferroelectric memory cells. In some examples, coupling the first section of ferroelectric memory cells may include activating the set of first switching components located between the first section of ferroelectric memory cells and a driver.

Discharge component 755 may discharge a capacitor of each ferroelectric memory cell of the first subset of ferroelectric memory cells to a plate line after activating each access device. In some examples, each capacitor may be discharged when the plate line and an access line coupled with the first subset of ferroelectric memory cells are at equal potential.

Figure 8:
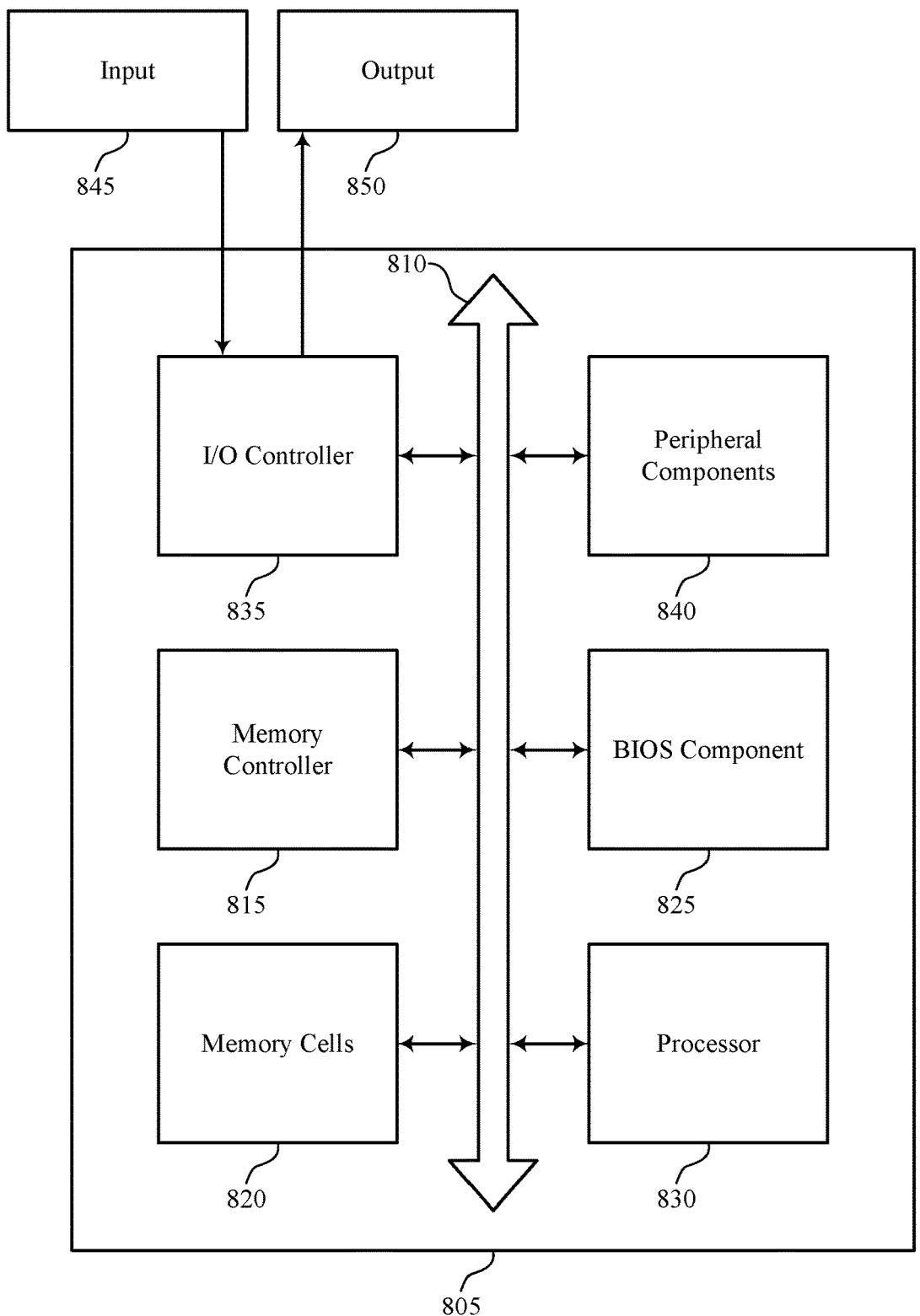
FIG. 8 illustrates a block diagram of a system including a section of ferroelectric memory cells that supports cell voltage accumulation discharge in accordance with examples of the present disclosure.

FIG. 8 shows a diagram of a system 800 including a device 805 that supports cell voltage accumulation discharge in accordance with examples of the present disclosure. Device 805 may be an example of or include the components of section of ferroelectric memory cells as described above, e.g., with reference to FIG. 1. Device 805 may include components for bi-directional voice and data communications including components for transmitting and receiving communications, including memory controller 815, memory cells 820, basic input/output system (BIOS) component 825, processor 830, I/O controller 835, and peripheral components 840. These components may be in electronic communication via one or more buses (e.g., bus 810).

Memory controller 815 may operate one or more memory cells as described herein. Specifically, memory controller 815 may be configured to support cell voltage accumulation discharge. In some cases, memory controller 815 may include a row decoder, column decoder, or both, as described herein (not shown).

Memory cells 820 may store information (i.e., in the form of a logical state) as described herein.

BIOS component 825 be a software component that includes BIOS operated as firmware, which may initialize and run various hardware components. BIOS component 825 may also manage data flow between a processor and various other components, e.g., peripheral components, input/output control component, etc. BIOS component 825 may include a program or software stored in read only memory (ROM), flash memory, or any other non-volatile memory.

Processor 830 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 830 may be configured to operate a memory array using a memory controller. In other cases, a memory controller may be integrated into processor 830. Processor 830 may be configured to execute computer-readable instructions stored in a memory to perform various functions (e.g., functions or tasks supporting cell voltage accumulation discharge).

I/O controller 835 may manage input and output signals for device 805. I/O controller 835 may also manage peripherals not integrated into device 805. In some cases, I/O controller 835 may represent a physical connection or port to an external peripheral. In some cases, I/O controller 835 may utilize an operating system such as iOS®, ANDROID®, MS-DOS®, MS-WINDOWS®, OS/2®, UNIX®, LINUX®, or another known operating system. In other cases, I/O controller 835 may represent or interact with a modem, a keyboard, a mouse, a touchscreen, or a similar device. In some cases, I/O controller 835 may be implemented as part of a processor. In some cases, a user may interact with device 805 via I/O controller 835 or via hardware components controlled by I/O controller 835.

Peripheral components 840 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 845 may represent a device or signal external to device 805 that provides input to device 805 or its components. This may include a user interface or an interface with or between other devices. In some cases, input 845 may be managed by I/O controller 835, and may interact with device 805 via a peripheral component 840.

Output 850 may also represent a device or signal external to device 805 configured to receive output from device 805 or any of its components. Examples of output 850 may include a display, audio speakers, a printing device, another processor or printed circuit board, etc. In some cases, output 850 may be a peripheral element that interfaces with device 805 via peripheral component(s) 840. In some cases, output 850 may be managed by I/O controller 835.

The components of device 805 may include circuitry designed to carry out their functions. This may include various circuit elements, for example, conductive lines, transistors, capacitors, inductors, resistors, amplifiers, or other active or inactive elements, configured to carry out the functions described herein. Device 805 may be a computer, a server, a laptop computer, a notebook computer, a tablet computer, a mobile phone, a wearable electronic device, a personal electronic device, or the like. Or device 805 may be a portion or aspect of such a device.

Figure 9:
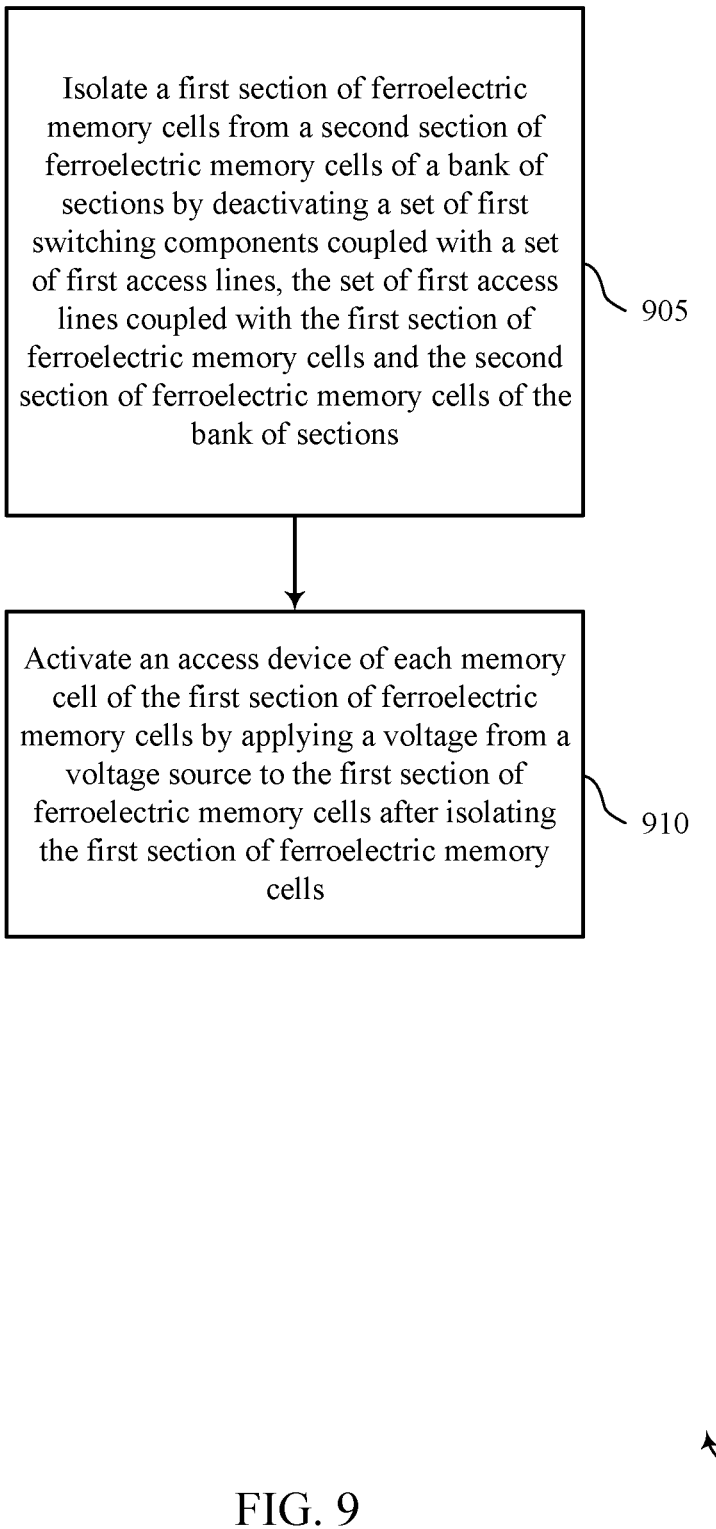
FIGS. 9 through 12 illustrate methods for cell voltage accumulation discharge in accordance with examples of the present disclosure.

FIG. 9 shows a flowchart illustrating a method 900 for cell voltage accumulation discharge in accordance with examples of the present disclosure. The operations of method 900 may be implemented by the methods and/or components described herein. For example, the operations of method 900 may be performed by a memory controller as described with reference to FIG. 1.

At 905 a first section of ferroelectric memory cells may be isolated from a second section of ferroelectric memory cells of a bank of sections by deactivating a plurality of first switching components coupled with a plurality of first access lines. In some examples, the plurality of first access lines may be coupled with the first section of ferroelectric memory cells and the second section of ferroelectric memory cells of the bank of sections. The operations of 905 may be performed according to the methods described herein. In certain examples, aspects of the operations of 905 may be performed by an isolation component as described with reference to FIG. 7.

At 910 an access device of each memory cell of the first section of ferroelectric memory cells may be activated by applying a voltage from a voltage source to the first section of ferroelectric memory cells after isolating the first section of ferroelectric memory cells. The operations of 910 may be performed according to the methods described herein. In certain examples, aspects of the operations of 910 may be performed by a activation component as described with reference to FIG. 7.

Figure 10:
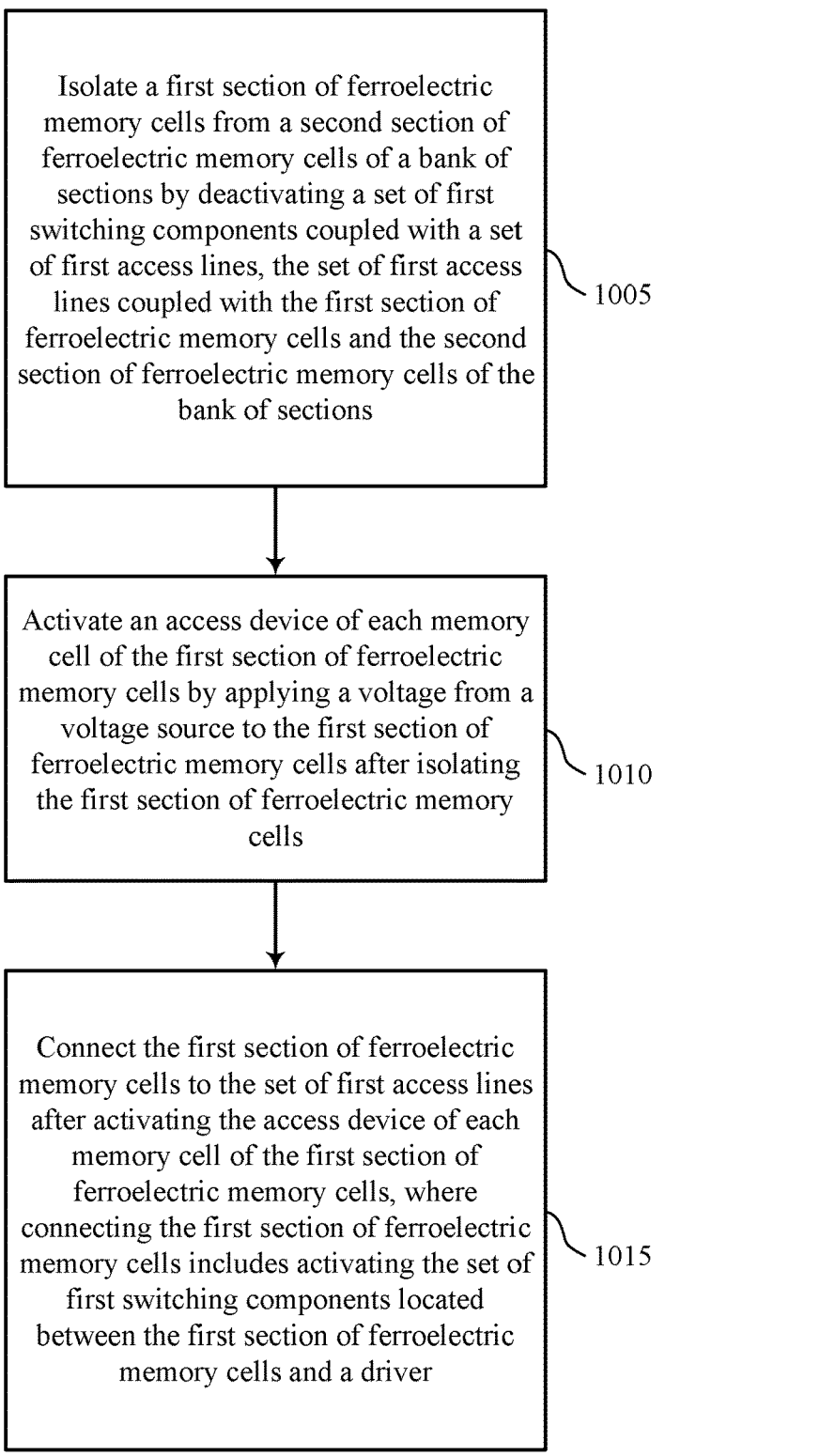

FIG. 10 shows a flowchart illustrating a method 1000 for cell voltage accumulation discharge in accordance with examples of the present disclosure. The operations of method 900 may be implemented by the methods and/or components described herein. For example, the operations of method 900 may be performed by a memory controller as described with reference to FIG. 7.

At 1005 a first section of ferroelectric memory cells may be isolated from a second section of ferroelectric memory cells of a bank of sections by deactivating a plurality of first switching components coupled with a plurality of first access lines. In some examples, the plurality of first access lines may be coupled with the first section of ferroelectric memory cells and the second section of ferroelectric memory cells of the bank of sections. The operations of 1005 may be performed according to the methods described herein. In certain examples, aspects of the operations of 1005 may be performed by an isolation component as described with reference to FIG. 7.

At 1010 an access device of each memory cell of the first section of ferroelectric memory cells may be activated by applying a voltage from a voltage source to the first section of ferroelectric memory cells after isolating the first section of ferroelectric memory cells. The operations of 1010 may be performed according to the methods described herein. In certain examples, aspects of the operations of 1010 may be performed by a activation component as described with reference to FIG. 7.

At 1015 the first section of ferroelectric memory cells may be coupled with the plurality of first access lines after activating the access device of each memory cell of the first section of ferroelectric memory cells. In some examples, coupling the first section of ferroelectric memory cells comprises activating the plurality of first switching components located between the first section of ferroelectric memory cells and a driver. The operations of 1015 may be performed according to the methods described herein. In certain examples, aspects of the operations of 1015 may be performed by a connection component as described with reference to FIG. 7.

In some cases, the method may include isolating a first section of ferroelectric memory cells from a second section of ferroelectric memory cells of a bank of sections by deactivating a plurality of first switching components coupled with a plurality of first access lines. In some examples, the plurality of first access lines may be coupled with the first section of ferroelectric memory cells and the second section of ferroelectric memory cells of the bank of sections.

In some cases, the method may include activating an access device of each memory cell of the first section of ferroelectric memory cells by applying a voltage from a voltage source to the first section of ferroelectric memory cells after isolating the first section of ferroelectric memory cells. In some examples, the method may include activating the access device of each ferroelectric memory cell of the first section of ferroelectric memory cells comprises activating at least one second switching component coupled with the voltage source and the first section of ferroelectric memory cells before applying the voltage to the first section of ferroelectric memory cells.

In some examples, the method may include coupling the first section of ferroelectric memory cells to the plurality of first access lines after activating the access device of each memory cell of the first section of ferroelectric memory cells. Coupling the first section of ferroelectric memory cells may include activating the plurality of first switching components located between the first section of ferroelectric memory cells and a driver. In some cases, the method may include isolating the first section of ferroelectric memory cells and the second section of ferroelectric memory cells from a third section of ferroelectric memory cells of the bank of sections by deactivating the plurality of first switching components coupled with the plurality of first access lines.

In other examples, the method may include activating the access device of each ferroelectric memory cell of the first section of ferroelectric memory cells and the second section of ferroelectric memory cells by applying the voltage to the first section of ferroelectric memory cells and the second section of ferroelectric memory cells after isolating the first section of ferroelectric memory cells and the second section of ferroelectric memory cells. In some cases, the method may include isolating a third section of ferroelectric memory cells from the second section of ferroelectric memory cells concurrent with isolating the first section of memory cells from the second section of ferroelectric memory cells of the bank of sections.

In some cases, the method may include activating an access device of each ferroelectric memory cell of the third section of ferroelectric memory cells, concurrent with activating the access device of each memory cell of the first section of ferroelectric memory cells, by applying the voltage to the third section of ferroelectric memory cells while the first section of ferroelectric memory cells and the third section of ferroelectric memory cells are isolated from the second section of ferroelectric memory cells.

Figure 11:
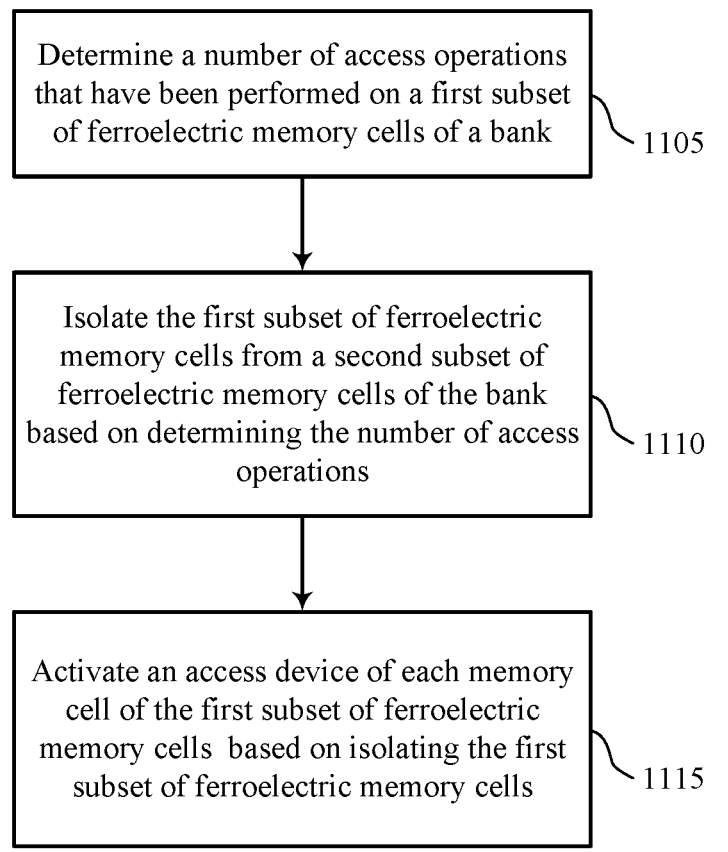

FIG. 11 shows a flowchart illustrating a method 1100 for cell voltage accumulation discharge in accordance with examples of the present disclosure. The operations of method 900 may be implemented by the methods and/or components described herein. For example, the operations of method 900 may be performed by a memory controller as described with reference to FIG. 1.

At 1105 a number of access operations that have been performed on a first subset of ferroelectric memory cells of a bank may be determined. The operations of 1105 may be performed according to the methods described herein. In certain examples, aspects of the operations of 1105 may be performed by a determination component as described with reference to FIG. 7.

At 1110 the first subset of ferroelectric memory cells may be isolated from a second subset of ferroelectric memory cells of the bank based at least in part on determining the number of access operations. The operations of 1110 may be performed according to the methods described herein. In certain examples, aspects of the operations of 1110 may be performed by an isolation component as described with reference to FIG. 6.

At 1115 an access device of each memory cell of the first subset of ferroelectric memory cells may be activated based at least in part on isolating the first subset of ferroelectric memory cells. The operations of 1115 may be performed according to the methods described herein. In certain examples, aspects of the operations of 1115 may be performed by a activation component as described with reference to FIG. 7.

Figure 12:
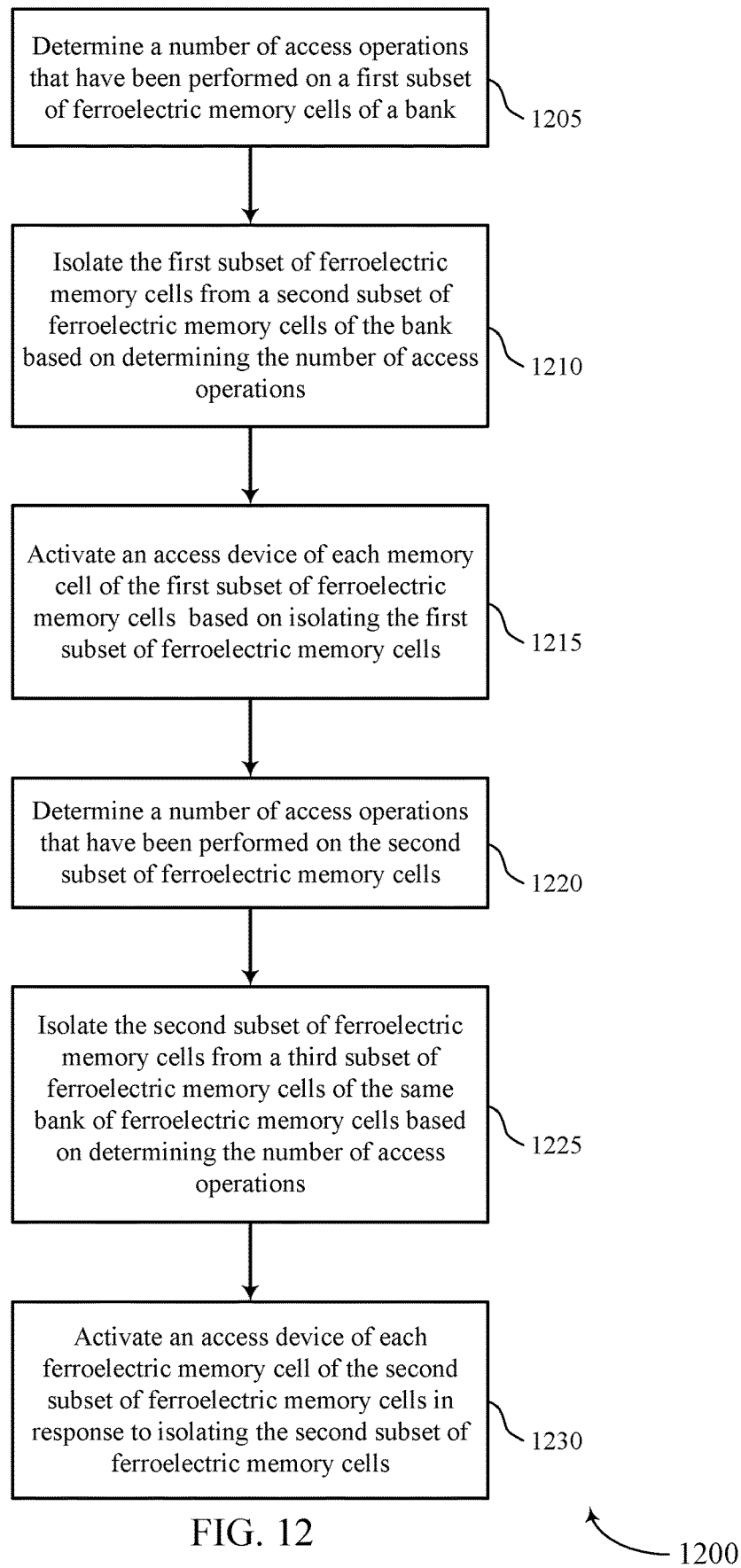

FIG. 12 shows a flowchart illustrating a method 1200 for cell voltage accumulation discharge in accordance with examples of the present disclosure. The operations of method 900 may be implemented by the methods and/or components described herein. For example, the operations of method 900 may be performed by a memory controller as described with reference to FIG. 1.

At 1205 a number of access operations that have been performed on a first subset of ferroelectric memory cells of a bank may be determined. The operations of 1205 may be performed according to the methods described herein. In certain examples, aspects of the operations of 1205 may be performed by a determination component as described with reference to FIG. 7.

At 1210 the first subset of ferroelectric memory cells may be isolated from a second subset of ferroelectric memory cells of the bank based at least in part on determining the number of access operations. The operations of 1210 may be performed according to the methods described herein. In certain examples, aspects of the operations of 1210 may be performed by an isolation component as described with reference to FIG. 7.

At 1215 an access device of each memory cell of the first subset of ferroelectric memory cells may be activated based at least in part on isolating the first subset of ferroelectric memory cells. The operations of 1215 may be performed according to the methods described herein. In certain examples, aspects of the operations of 1215 may be performed by a activation component as described with reference to FIG. 7.

At 1220 a number of access operations that have been performed on the second subset of ferroelectric memory cells may be determined. The operations of 1220 may be performed according to the methods described herein. In certain examples, aspects of the operations of 1220 may be performed by a determination component as described with reference to FIG. 7.

At 1225 the second subset of ferroelectric memory cells may be isolated from a third subset of ferroelectric memory cells of the same bank of ferroelectric memory cells based at least in part on determining the number of access operations. The operations of 1225 may be performed according to the methods described herein. In certain examples, aspects of the operations of 1225 may be performed by an isolation component as described with reference to FIG. 7.

At 1230 an access device of each ferroelectric memory cell of the second subset of ferroelectric memory cells may be activated in response to isolating the second subset of ferroelectric memory cells. The operations of 1230 may be performed according to the methods described herein. In certain examples, aspects of the operations of 1230 may be performed by a activation component as described with reference to FIG. 7.

In some cases, the method may include determining a number of access operations that have been performed on a first subset of ferroelectric memory cells of a bank. In some cases, the method may include discharging a capacitor of each ferroelectric memory cell of the first subset of ferroelectric memory cells to a plate line after activating each access device, wherein each capacitor is discharged when the plate line and an access line coupled with the first subset of ferroelectric memory cells are at equal potential. In some examples, the method may include activating an access device of each memory cell of the first subset of ferroelectric memory cells based at least in part on isolating the first subset of ferroelectric memory cells.

In some examples, the method may include determining a number of access operations that have been performed on the second subset of ferroelectric memory cells. Additionally or alternatively, the method may include isolating the second subset of ferroelectric memory cells from a third subset of ferroelectric memory cells of the same bank of ferroelectric memory cells based at least in part on determining the number of access operations. In some cases, the method may include isolating the first subset of ferroelectric memory cells from a second subset of ferroelectric memory cells of the bank based at least in part on determining the number of access operations. In some examples, the number of access operations that have been performed on the first subset of ferroelectric memory cells is determined using a counter.

In other examples, the method may include isolating the first subset of ferroelectric memory cells based at least in part on the counter exceeding a threshold. In some cases, the method may include isolating the first subset of ferroelectric memory cells by deactivating a plurality of switching components coupled with an access line in electronic communication with a plurality of subsets of ferroelectric memory cells of the same bank of ferroelectric memory cells.

In some examples, the method may include activating the access device of each ferroelectric memory cell of the first subset of ferroelectric memory cells based at least in part on an adjustment of a voltage of the first subset of ferroelectric memory cells. In other examples, the method may include activating an access device of each ferroelectric memory cell of the second subset of ferroelectric memory cells in response to isolating the second subset of ferroelectric memory cells.

It should be noted that the methods described above describe possible implementations, and that the operations and the steps may be rearranged or otherwise modified and that other implementations are possible. Furthermore, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be coupled with other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving, at an equalization component of a memory device, an equalization command;
   determining that a quantity of access operations performed on a first section of memory cells based at least in part on receiving the equalization command; and
   isolating the first section of memory cells from a second section of memory cells based at least in part on the quantity of access operations satisfying a threshold value.

2. The method of claim 1, wherein determining that the quantity of access operations satisfies the threshold value comprises:
   tracking the quantity of access operations performed on the first section of memory cells for a duration; and
   determining that the quantity of access operations performed on the first section of memory cells without the memory cells of the first section being discharged.

3. The method of claim 1, further comprising:
discharging a plate line of each memory cell of the first section to a plate discharge line based at least in part on isolating the first section of memory cells from the second section of memory cells; and
storing a charge associated with the discharged plate line of each memory cell of the first section at a capacitor coupled with the plate discharge line.

4. The method of claim 3, further comprising:
activating a voltage source coupled with the capacitor based at least in part on discharging the plate line of each memory cell of the first section to the plate discharge line; and
storing a second charge at the capacitor based at least in part on activating the voltage source.

5. The method of claim 4, further comprising:
discharging the capacitor to a voltage application line coupled with a word line of the first section of memory cells, wherein an access device of each memory cell of the first section is activated based at least in part on discharging the capacitor to the voltage application line.

6. The method of claim 1, further comprising:
activating a first switching component activation line coupled with a first switching component, wherein:
activating the first switching component activation line activates the first switching component to couple the first section of memory cells with a word line; and
the first section of memory cells is isolated from the second section of memory cells based at least in part on the activating the first switching component activation line.

7. The method of claim 1, further comprising:
activating a second switching component activation line coupled with a second switching component, wherein activating the second switching component activation line activates the second switching component to couple the first section of memory cells with a negative word line after the first section is isolated from the second section of memory cells.

8. The method of claim 7, further comprising:
equilibrating each memory cell of the first section of memory cells to within a range of a same voltage based at least in part on activating the second switching component activation line.

9. An apparatus, comprising:
a bank of memory cells comprising a plurality of sections;
a driver coupled with a first section of memory cells of the plurality of sections via a word line;
a negative word line coupled with the driver; and
an equalization component coupled with the negative word line and configured to track a quantity of access operations performed on the first section of memory cells and isolate the first section from a second section of the plurality of sections based at least in part on the quantity of access operations satisfying a threshold.

10. The apparatus of claim 9, further comprising:
an equalization command line coupled with the equalization component, wherein the equalization component is configured to receive an equalization command and is configured to determine the quantity of access operations performed on the first section of memory cells based at least in part on receiving the equalization command.

11. The apparatus of claim 10, wherein the equalization component comprises:

a counter coupled with the equalization command line and configured to initiate tracing the quantity of access operations performed on the first section of memory cells based at least in part on receiving the equalization command.

12. The apparatus of claim 9, wherein the equalization component comprises:
a plate discharge line coupled with a plate line of each memory cell of the first section; and
a capacitor coupled with the plate discharge line and configured to receive a charge based at least in part on at least one of the plate lines of the first section being discharged.

13. The apparatus of claim 12, further comprising:
a voltage source coupled with the capacitor and configured to supply a charge to the capacitor based at least in part on at least one of the plate lines of the first section being discharged.

14. The apparatus of claim 12, further comprising:
a voltage application line coupled with the capacitor and the word line, wherein the capacitor is configured to discharge onto the voltage application line to activate an access device of each memory cell of the first section when the first section is isolated from the second section.

15. The apparatus of claim 9, wherein the equalization component comprises:
a switching component activation line coupled with a first switching component and configured to, based at least in part on the equalization component receiving an equalization command, activate the first switching component to couple the first section of memory cells with the word line, wherein the first section is isolated from the second section based at least in part on activating of the first switching component.

16. The apparatus of claim 15, wherein the switching component activation line is configured to, based at least in part on the first switching component being activated, activate a second switching component to couple the first section of memory cells to the negative word line after the first section is isolated from the second section.

17. A method, comprising:
isolating a first section of memory cells from a second section of memory cells, based at least in part on a quantity of access operations performed on the first section of memory cells, by deactivating a switching component coupled with an access line of a plurality of first access lines; and
activating an access device of each memory cell of the first section of memory cells by applying a voltage to the first section of memory cells after isolating the first section of memory cells.

18. The method of claim 17, further comprising:
activating a second switching component located between the first section of memory cells and a driver after activating the access device of each memory cell of the first section of memory cells, wherein activating the second switching component couples the first section of memory cells to at least one of the plurality of first access lines.

19. The method of claim 17, further comprising:
determining the quantity of access operations that have been performed on the first section of memory cells, wherein isolating the first section of memory cells is based at least in part on the quantity of access operations satisfying a threshold value.

20. The method of claim 19, further comprising:

updating a counter of an equalization component coupled with the first section of memory cells based at least in part on performing an access operation on the first section of memory cells, wherein determining the quantity of access operations performed on the first section of memory cells is based on a value of the counter after updating the counter.

\* \* \* \* \*